Figure 1:
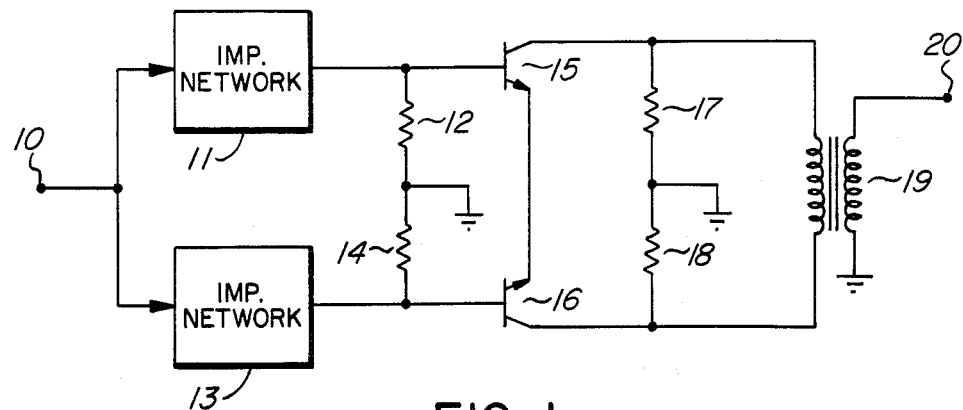

United States Patent [19]

Taralp

[11] Patent Number: 4,609,887
[45] Date of Patent: Sep. 2, 1986

[54] DELAY EQUALIZER

[75] Inventor: Güner Taralp, Ottawa, Canada

[73] Assignee: Northern Telecom Limited, Montreal, Canada

[21] Appl. No.: 602,209

[22] Filed: Apr. 19, 1984

[51] Int. Cl.⁴ .............................................. H03H 11/26
[52] U.S. Cl. ................................. 333/28 R; 330/304
[58] Field of Search ....................... 330/126, 302, 304; 333/28 R

[56] References Cited

U.S. PATENT DOCUMENTS

| | | | |
|---|---|---|---|
| 3,769,586 | 10/1973 | Shapiro et al. | 330/302 X |
| 3,831,117 | 8/1974 | Fletcher et al. | 330/302 |
| 4,032,855 | 6/1977 | Holman, II | 330/304 X |
| 4,403,201 | 9/1983 | Yokoyama | 330/304 |
| 4,490,693 | 12/1984 | Behrend | 333/28 R |

Primary Examiner—Paul Gensler
Attorney, Agent, or Firm—R. John Haley

[57] ABSTRACT

A delay equalizer includes an amplifier with differential inputs, to which an input of the equalizer is coupled via first and third impedance circuits, and which are coupled to circuit ground via second and fourth impedance circuits, respectively. One of the first and second impedance circuits is constituted by a resistor, the other by a frequency-dependent network consisting of one or more tuned network sections. The third and fourth impedance circuits can similarly be a frequency-dependent network and a resistor or, desirably, two resistors. The amplifier can be a bipolar transistor whose base and emitter form the differential inputs. The equalizer can also include input and output impedance-matching amplifier stages, which may also provide amplitude equalization.

11 Claims, 6 Drawing Figures

DELAY EQUALIZER

This invention relates to delay equalizers, which are also known as group delay equalizers, phase equalizers, and all-pass networks.

In order to correct for changes in the phase of a signal across a frequency band, it is known to provide a delay equalizer which has a phase-frequency response providing complementary phase or delay changes. Such a delay equalizer has a constant gain across the frequency band. Delay equalizers are commonly used for example in wide-band radio transmission systems.

A delay equalizer can be formed by a passive two-port lattice network, but passive delay equalizers involve problems of tuning and matching if more than a single simple network section is needed for the required level of equalization. Active delay equalizers are also known, generally comprising a phase-splitting transistor whose two output paths are combined, one of the output paths including a frequency dependent network. One such equalizer is described in Heinemann U.S. Pat. No. 3,631,270 issued Dec. 28, 1971. However, extension of such equalizers to include multiple sections is limited, so that such equalizers do not provide significant advantages over passive equalizers.

An object of this invention, therefore, is to provide an improved delay equalizer.

According to this invention there is provided a delay equalizer comprising: an input for a signal to be equalized; amplifier means having first and second differential inputs and an output for an equalized signal; first impedance means coupled between the input and the first differential input; second impedance means coupled between the first differential input and a point of reference potential; third impedance means coupled between the input and the second differential input; and fourth impedance means coupled between the second differential input and the point of reference potential; the second impedance means comprising a frequency-dependent impedance network comprising at least one resonant circuit, the first and third impedance means each comprising a resistive impedance.

The fourth impedance means preferably comprises a resistive impedance, but may alternatively comprise a frequency-dependent impedance network, which for example consists of one or more network sections each comprising a series or parallel-resonant tuned circuit.

Advantageously the amplifier means comprises a bipolar transistor having a base constituting the first differential input, an emitter constituting the second differential input, and a collector coupled to said output. This results in a particularly convenient, simple, and economic delay equalizer.

The delay equalizer may also include an amplifier stage coupled between the input of the equalizer and the first and third impedance means, which amplifier stage may comprise amplitude equalizing means for compensating for changes in gain with frequency due to the frequency-dependent impedance network of the delay equalizer being non-ideal or lossy, and/or an amplifier stage coupled between the collector of said bipolar transistor and the output of the delay equalizer. Such amplifier stages are preferably provided for input and output impedance matching of the delay equalizer.

Figure 2:
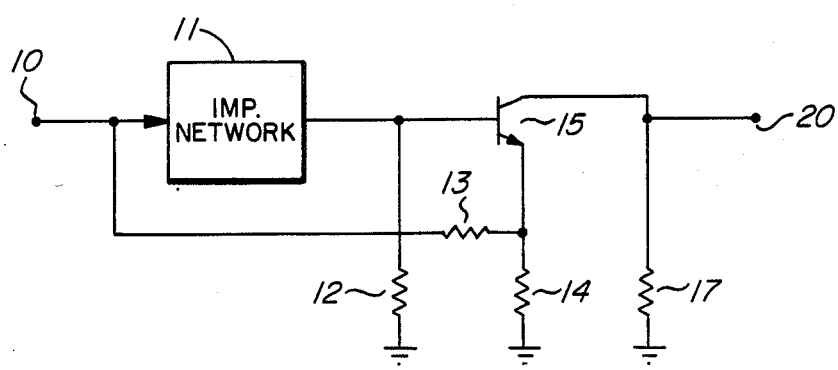
Figure 3:
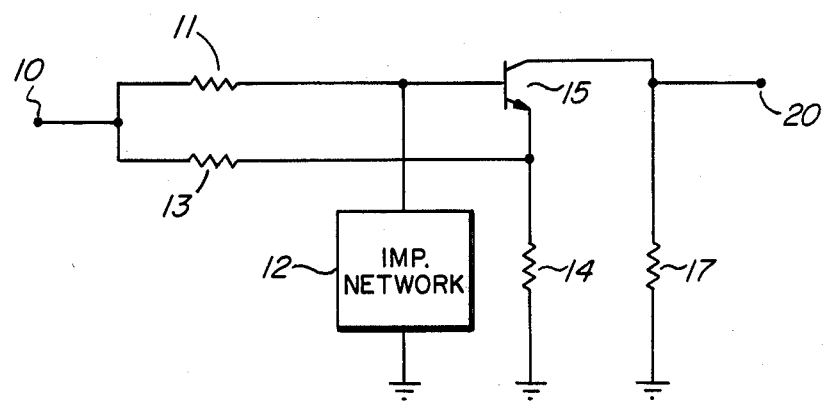
Figure 4:
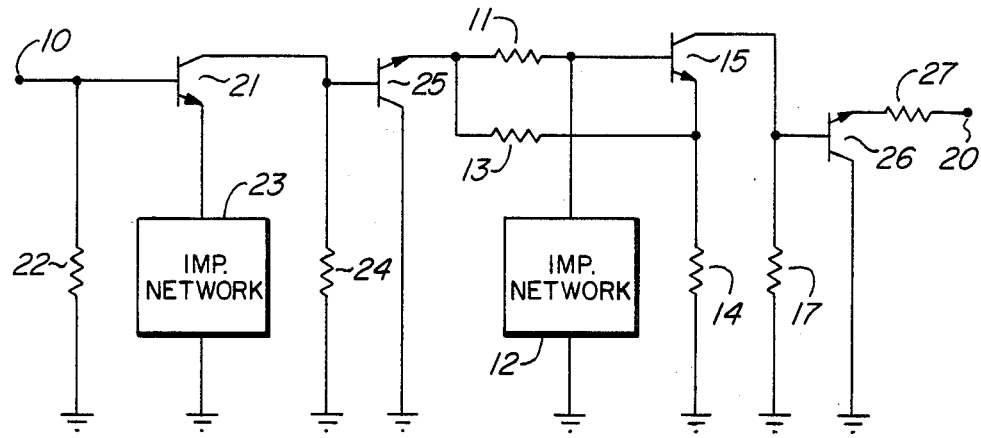
Figure 5:
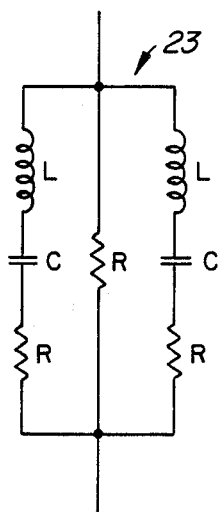
Figure 6:
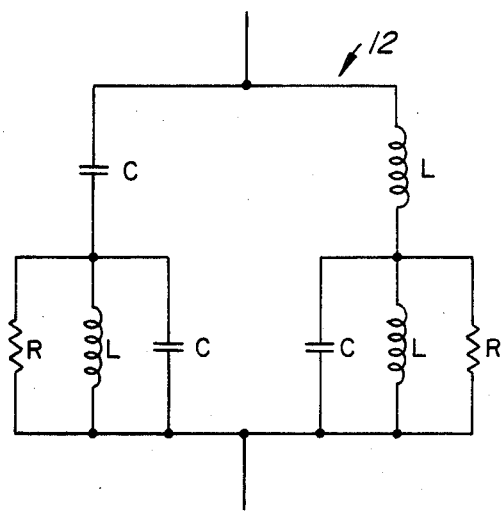

The invention will be further understood from the following description with reference to the accompanying drawings, in which:

FIGS. 1 to 4 schematically illustrate delay equalizers in accordance with alternative embodiments of the invention; and FIGS. 5 and 6 schematically illustrate impedance networks used in the equalizer of FIG. 4.

The same references are used in the different figures of the drawings to denote similar components. In the drawings, d.c. biassing circuitry for the various transistors illustrated is not shown for the sake of clarity and simplicity; such circuitry is provided in known manner.

Referring to FIG. 1, the delay equalizer illustrated therein comprises an input terminal 10, impedance means 11, 12, 13, and 14 which are further described below, two bipolar transistors 15 and 16 having collector load resistances 17 and 18 respectively, and an output transformer 19 via which the collectors of the transistors 15 and 16 are coupled to an output terminal 20.

As illustrated in FIG. 1, the impedance means 11 to 14 comprise respectively an impedance network 11 coupled between the input 10 and the base of the transistor 15, a resistor 12 coupled between the base of the transistor 15 and a reference potential constituted by circuit ground, an impedance network 13 coupled between the input 10 and the base of the transistor 16, and a resistor 14 coupled between the base of the transistor 16 and circuit ground. The emitters of the transistors 15 and 16 are coupled together, whereby the transistors constitute a differential amplifier having differential inputs constituted by the bases of the transistors.

The impedance networks 11 and 13 comprise frequency dependent impedances constituted by inductances and capacitances arranged in series-resonant and/or parallel-resonant circuits in one or more network sections. The resonant circuits are tuned by adjusting the inductances and/or capacitances to provide the equalizer with the desired response.

The equalizer of FIG. 1 may be modified by interchanging the positions of the resistors 12 and 14 with the impedance networks 11 and 13, in the same manner as is described below with reference to FIGS. 2 and 3.

The equalizer of FIG. 1 involves the disadvantage of having two impedance networks 11 and 13, each of which must be tuned for the desired response. This disadvantage may be avoided by replacing one of the impedance networks, for example the network 13, by a resistor which has the same resistance as the resistor 14. This results in a 6 dB loss, but this is readily compensated for by gain provided by the transistors 15 and 16, and has the advantage of halving the number of tunable components in the equalizer.

The delay equalizer of FIG. 1 can be further modified to make it completely single-sided by omitting the transistor 16, resistor 18, and transformer 19, and by connecting the junction between the impedance means 13 and 14 to the emitter of the transistor 15, as shown in FIG. 2. In this case the single transistor 15 constitutes an amplifier with the differential inputs constituted by its base and emitter respectively. The impedance means 13 and 14 are in this case constituted by equal-resistance resistors denoted by the same references, the 6 dB loss resulting therefrom being compensated by an offsetting gain provided by the transistor 15.

The delay equalizer of FIG. 3 differs from that of FIG. 2 in having the position of the impedance network changed, so that the impedance means 11 is constituted by a resistor and the impedance means 12 is constituted by an impedance network. This change, which can also be applied to the equalizer of FIG. 1 as indicated above, provides the advantage that the impedance network is no longer floating with respect to circuit ground, as in FIG. 2, but has one side grounded, thereby facilitating the design and tuning of the impedance network.

FIG. 4 illustrates a delay equalizer which includes the equalizer of FIG. 3 together with input and output amplifiers which serve for impedance matching. In addition, the input amplifier in FIG. 4 includes an amplitude equalizing impedance network for compensating for small variations in gain with frequency due to the use of a multiple-section impedance network 12 as described below.

Referring to FIG. 4, the input amplifier couples the input terminal to the impedance means 11 and 13 and comprises a common-emitter transistor 21 having its base connected to the input terminal 10, an input impedance matching resistor 22 coupled between the input terminal 10 and circuit ground, the amplitude equalizing impedance network 23 coupled between the emitter of the transistor 21 and circuit ground, a collector load resistor 24 for the transistor 21, and a common-collector buffer stage comprising a transistor 25 having its base coupled to the collector of the transistor 21 and its emitter coupled to the impedance means 11 and 13. The output amplifier comprises a common-collector buffer stage comprising a transistor 26 having its base coupled to the collector of the transistor 15 and its emitter coupled to the output terminal 20 via an output impedance matching resistor 27.

By way of further explanation, it is observed that the various resistors in the delay equalizer of FIG. 4 may have the following resistances, given in ohms, to provide a unity-gain equalizer for matching to 75 ohm input and output impedances and assuming that the network 23 has an impedance equivalent to a resistor of 100 ohms:

| Resistor | Resistance (ohms) |
| --- | --- |
| 11, 13, 14, 17 | 150 |
| 22, 27 | 75 |
| 24 | 200 |

With these resistances, the transistor 21 provides a voltage gain of x2 and the transistor 26 provides a voltage gain of x½, with unity gain therebetween to provide the overall unity gain.

The impedance network 12 can be of any desired form, consisting of one or more parallel-resonant and-/or series-resonant network sections to provide a desired delay characteristic. Up to about four network sections can be tuned without excessive difficulty; if more network sections than this are required, these can be divided between two phase equalizers each as illustrated in FIG. 4 and connected in cascade.

Depending on the complexity of the network 12, the amplitude equalizing network 23 may or may not be required. For a single network section in the network 12, amplitude equalization to compensate for gain changes due to this network 12 is generally not required, so that the impedance network 23 can be constituted by a single resistor. For more complicated networks 12, the amplitude equalizing impedance network 23 can, like the impedance network 12, consist of one or more parallel-resonant and/or series-resonant tuned circuits.

FIGS. 5 and 6 illustrate one form which the impedance networks 23 and 12 respectively may have in the equalizer of FIG. 4. The impedance network 12 consists of three network sections comprising tuned circuits formed by inductors L and capacitors C, together with resistors R which serve to balance the Q-factors of the tuned circuits to provide smooth amplitude- and phase-frequency characteristics, the former being easily corrected by the amplitude equalization stage. The impedance network 23 consists of two series-resonant tuned circuits connected in parallel and comprising inductors L, capacitors C, and resistors R, these being adjusted to provide the overall equalizer of FIG. 4 with unity gain which is constant with changing frequency.

The particular impedance networks shown in FIGS. 5 and 6 are illustrated by way of example, and numerous equivalent and alternative forms of impedance network known in the art may be used in their place. Numerous other modifications, variations, and adaptations may be made to the particular embodiments of the invention described above, without departing from the scope of the invention which is defined by the claims.

What is claimed is:

1. A delay equalizer comprising:
   an input for a signal to be equalized;
   amplifier means having first and second differential inputs and an output for an equalized signal;
   first impedance means coupled between the input and the first differential input;
   second impedance means coupled between the first differential input and a point of reference potential;
   third impedance means coupled between the input and the second differential input; and
   fourth impedance means coupled between the second differential input and the point of reference potential;
   the second impedance means comprising a frequency-dependent network comprising at least one resonant circuit, and the first and third impedance means each comprising a resistive impedance.

2. A delay equalizer as claimed in claim 1 wherein the fourth impedance means comprises a resistive impedance.

3. A delay equalizer as claimed in claim 2 wherein the amplifier means comprises a bipolar transistor having a base constituting the first differential input, an emitter constituting the second differential input, and a collector coupled to said output.

4. A delay equalizer as claimed in claim 3 and including an amplifier stage coupled between the input of the equalizer and the first and third impedance means.

5. A delay equalizer as claimed in claim 4 wherein the amplifier stage comprises amplitude equalizing means for compensating for changes in gain with frequency.

6. A delay equalizer as claimed in claim 4 wherein the amplifier stage comprises a common emitter transistor having a base coupled to the input of the delay equalizer, a collector coupled to the first and third impedance means, and a frequency-dependent impedance network in its emitter circuit.

7. A delay equalizer as claimed in claim 3 and including an amplifier stage coupled between the collector of said bipolar transistor and the output of the delay equalizer.

8. A delay equalizer as claimed in claim 1 wherein the fourth impedance means comprises a frequency-dependent impedance network.

9. A delay equalizer as claimed in claim 1 wherein the amplifier means comprises a bipolar transistor having a base constituting the first differential input, an emitter constituting the second differential input, and a collector coupled to said output.

10. A delay equalizer as claimed in claim 4 and including an amplifier stage coupled between the collector of said bipolar transistor and the output of the delay equalizer.

11. A delay equalizer as claimed in claim 5 and including an amplifier stage coupled between the collector of said bipolar transistor and the output of the delay equalizer.

* * * * *